(12) United States Patent
Yamada

(10) Patent No.: US 6,809,410 B2
(45) Date of Patent: Oct. 26, 2004

(54) POWER SEMICONDUCTOR MODULE

(75) Inventor: Junji Yamada, Tokyo (JP)

(73) Assignee: Mitsubishi Denki Kabushiki Kaisha, Toko (JP)

( * ) Notice: Subject to any disclaimer, the term of this patent is extended or adjusted under 35 U.S.C. 154(b) by 0 days.

(21) Appl. No.: 09/828,947

(22) Filed: Apr. 10, 2001

(65) Prior Publication Data

US 2002/0062973 A1 May 30, 2002

(30) Foreign Application Priority Data

Nov. 30, 2000 (JP) ........................................ 2000-364814

(51) Int. Cl.[7] .............................................. H01L 23/02
(52) U.S. Cl. .................... 257/678; 257/502; 257/503; 257/693; 257/694; 257/782; 257/784
(58) Field of Search ................................. 257/678, 684, 257/502, 503, 690, 691, 692, 693, 694, 788, 782, 784, 730, 726, 704, 723, 698; 470/6, 10, 11; 411/81, 190, 427, 366.1

(56) References Cited

U.S. PATENT DOCUMENTS

| | | | | |
|---|---|---|---|---|
| 4,018,132 A | * | 4/1977 | Abe | 85/1 L |
| 4,022,536 A | * | 5/1977 | Piepho et al. | 403/16 |
| 4,231,736 A | * | 11/1980 | Reilly | 433/6 |
| 4,659,267 A | * | 4/1987 | Uno et al. | 411/5 |
| 4,793,192 A | * | 12/1988 | Jerger et al. | 324/174 |
| 4,915,652 A | * | 4/1990 | Madara | 439/607 |
| 5,228,795 A | * | 7/1993 | Gray | 403/30 |
| 5,263,115 A | * | 11/1993 | Kauo et al. | 219/386 |
| 5,646,445 A | * | 7/1997 | Masumoto | 257/723 |
| 6,030,162 A | * | 2/2000 | Huebner | 411/413 |
| 6,053,653 A | * | 4/2000 | Tanaka et al. | 403/282 |

FOREIGN PATENT DOCUMENTS

| | | | | |
|---|---|---|---|---|
| EP | 0591900 A2 | * | 4/1994 | |
| GB | 2221793 A | * | 2/1990 | |
| JP | 07-279109 | * | 10/1995 | |
| JP | 408135205 | * | 5/1996 | |
| JP | 40955462 A | * | 2/1997 | |
| JP | 2001206104 A | * | 7/2001 | ........... B60K/37/00 |
| JP | 2002339924 A | * | 11/2002 | ............. F16B/7/18 |

* cited by examiner

Primary Examiner—David Zarneke
Assistant Examiner—Thanh Y. Tran
(74) Attorney, Agent, or Firm—Oblon, Spivak, McClelland, Maier & Neustadt, P.C.

(57) ABSTRACT

A power semiconductor module with a connection structure in which an electrode terminal whose one end is connected with an electric power semiconductor device which is resin sealed inside of the case, is exposed along an outer surface of a case for taking out electrode from the semiconductor device, and is electrically connected to an electrode for external connection disposed on the electrode terminal, wherein a female screw hole for screwing is provided on side of the outer surface of the case, a male screw member formed at its opposite ends with screw threads is threadedly engaged with the female screw hole through the electrode terminal.

4 Claims, 5 Drawing Sheets

POWER SEMICONDUCTOR MODULE

BACKGROUND OF THE INVENTION

The present invention relates to a connection structure between an external connecting electrode and an electrode terminal of a power semiconductor module on an exterior case for power semiconductor module.

FIG. 9 is a cross-sectional explanatory view showing one example of a conventionally known connection structure between an electrode terminal and an electrode plate which is an exterior connecting electrode on an exterior case for power semiconductor module. The exterior case 82 for power semiconductor module includes an electrode terminal 83 and a terminal nut 85. One end of the electrode terminal 83 is electrically connected to an electrode plate 97 on the side of an outer surface of the case. The terminal nut 85 is used for fastening the electrode terminal 83 and the electrode plate 97 on an upper surface of the case. The electrode terminal 83 and the terminal nut 85 are integrally insert-formed together with a case body in a step for molding an exterior case 82. After the insert-forming, the electrode terminal 83 is bent such as to cover the terminal nut 85. The electrode terminal 83 is formed with a bolt-insertion hole 84 along its thickness direction. In a state in which the electrode terminal 83 is bent, a center axis of the bolt-insertion hole 84 coincides with a center axis of a female screw hole of the terminal nut 85 fixed on the side of an outer surface of the case.

To connect the electrode plate 97 with electrode terminal 83, the electrode plate 97 is positioned on the electrode terminal 83 such that a center axis of a bolt-insertion hole 98 formed along a thickness direction of the electrode plate 97 coincides with a center axis of the female screw hole of the terminal nut 85 and the bolt-insertion hole 84 of the electrode terminal 83, and in this state, a fastening bolt 89 is fastened to the terminal nut 85 through the electrode plate 97 and the electrode terminal 83. With this operation, the electrode plate 97 and the electrode terminal 83 are electrically connected to each other, and an electric signal generated in the power semiconductor module is introduced into the electrode plate 97 through the electrode terminal 83.

However, in the case of the conventional power semiconductor module having the connecting structure with the external connection electrode (i.e. electrode plate 97), it is necessary to fasten the fastening bolt 89 in a state in which the electrode plate 97 is held at a predetermined position. This makes it troublesome to position the electrode plate 97 with respect to the electrode terminal 83 when the number of electrode terminals included in the power semiconductor module is large. Especially when a large number of power semiconductor modules are used, or when the power semiconductor module is located at a position where it is difficult to position the electrode plate 97 to the electrode terminal 83, there is a problem that the working time to assemble power semiconductor module becomes longer.

It is an object of the invention to provide a connection structure between an external connecting electrode and an electrode terminal of a power semiconductor module on an exterior case for power semiconductor module, which is capable of using an existing power semiconductor module as it is, capable of easily positioning an external connection electrode with respect to an electrode terminal, and capable of realizing efficient assembling operation.

SUMMARY OF THE INVENTION

According to an aspect of the present invention, there is provided a power semiconductor module with a connection structure in which an electrode terminal whose one end is connected with an electric power semiconductor device which is resin sealed inside of the case, is exposed along an outer surface of a case for taking out electrode from the semiconductor device, and is electrically connected to an electrode for external connection disposed on the electrode terminal, wherein a female screw hole for screwing is provided on side of the outer surface of the case, a male screw member formed at its opposite ends with screw threads is threadedly engaged with the female screw hole through the electrode terminal.

A nut having the female screw hole may be embedded in the outer surface of the case, and the nut may be fixed to a lower surface of the electrode terminal.

The electrode terminal may have the female screw hole.

The male screw member may have different nominal diameters at opposite ends.

The male screw member may have threads at opposite ends of which directions are opposite from each other.

At least one nut may be fixed to a middle portion of the male screw member.

A middle portion of the male screw member may be formed with a discontinuous portion having no screw thread.

The male screw member may be threadedly engaged with the female screw hole through a plurality of electrode terminals.

Embodiments of the present invention will be explained with reference to the accompanying drawings below.

DESCRIPTION OF THE PREFERRED EMBODIMENTS

First Embodiment

Figure 1:
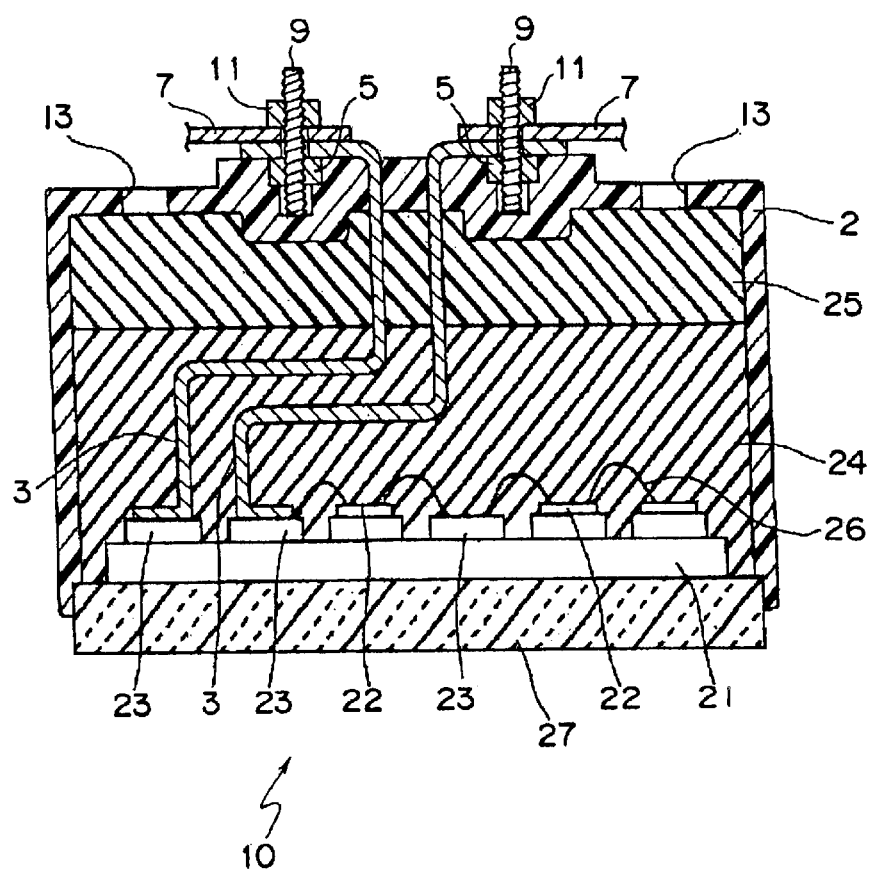
FIG. 1 is a cross-sectional explanatory view showing an essential structure of a power semiconductor module according to an first embodiment of the present invention.

FIG. 1 is a cross-sectional explanatory view schematically showing an essential structure of a power semiconductor module according to the first embodiment of the present invention. In this power semiconductor module 10, a reference number 21 represents an insulation substrate, for example, comprised of a ceramic substrate. A plurality of circuit conductive foils 23 are formed on an upper surface of the insulation substrate 21. Electric power semiconductor devices 22 are fixed to upper surfaces of some of the circuit conductive foils 23, and aluminum wires 26 are connected between electrodes of the electric power semiconductor devices 22 and other circuit conductive foils 23. A heat radiation plate 27 is fixed to a lower surface of the insulation substrate 21. The heat radiation plate 27 radiates heat generated by the electric power semiconductor devices 22.

The power semiconductor module 10 is sealed with resin by covering an active body comprising the above-described members 21, 22, 23, 26 and 27 with an exterior case 2, and sequentially infusing silicon resin and epoxy resin into the exterior case 2 from a infusing window 13 formed in the exterior case 2.

The exterior case 2 is a resin case and comprises electrode terminals 3 having one ends which are electrically connected to electrode plates 7 which are exterior connection electrodes on side of an outer surface of the case, and terminal nuts 5 used for fixing the electrode terminals 3 and the electrode plates 7 on side of an upper surface of the case. The electrode terminals 3 and the terminal nuts 5 are integrally formed with a case body by means of insert molding in a step for molding the exterior case 2. One ends of the electrode terminals 3 are electrically connected to the electrode plates 7 on side of the outer surface of the case, and the other ends are connected to the circuit conductive foils 23 (left side two circuit conductive foils in this embodiment) to which the electric power semiconductor devices 22 are not fixed. It is noted that the step for molding the exterior case 2 is carried out before the power semiconductor module is assembled and resin is infused.

Figure 2:
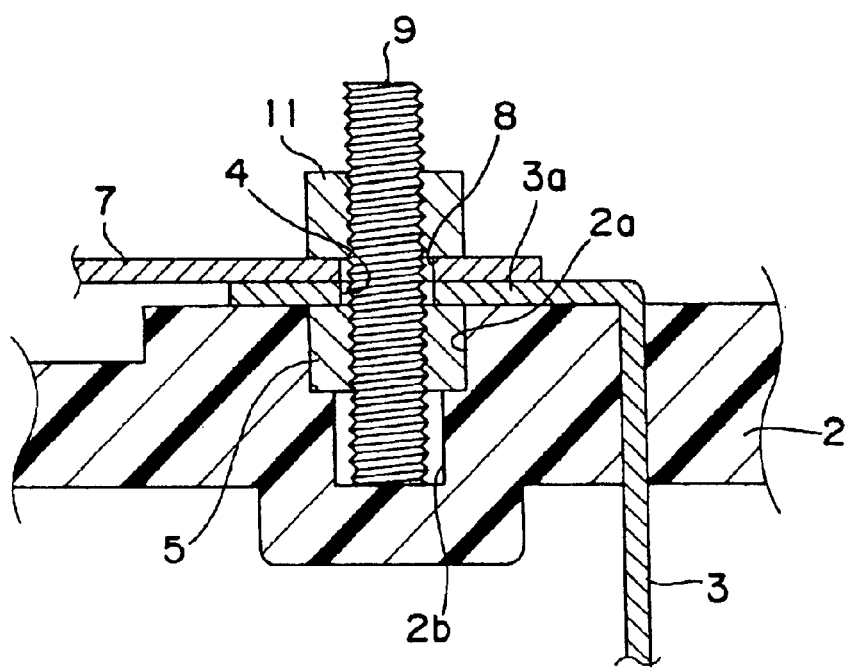
FIG. 2 is an enlarged cross-sectional explanatory view of a connection structure between an electrode terminal and an external connection electrode on an exterior case for the power semiconductor module.

FIG. 2 is an enlarged view of the connection structure between the electrode terminals 3 and the electrode plates 7 which are exterior connection electrodes on the exterior case 2 for the power semiconductor module 10. The exterior case 2 includes continuous two-step recesses, i.e., first recesses 2a opened at an outer surface of the case for inserting the terminal nuts 5, and second recesses 2b formed to open at bottom surface of the first recesses 2a. Among them, each of the first recesses 2a has the same shape and size as those of the terminal nut 5. In this embodiment, since the terminal nut 5 is a hexagonal nut, the first recess 2a has a recess-shape whose cross section perpendicular to its center axis is hexagon, and its depth is set equal to a height of an outer surface of the terminal nut 5.

On the other hand, the second recess 2b is a hole having a center axis coinciding with the center axis of the first recess 2a, and its shape and size are set such that when a fastening male screw member 9 is threadedly engaged with the terminal nut 5, a lower end of the fastening male screw member 9 can project from a lower surface of the terminal nut 5.

As can be understood from FIG. 2, each of the electrode terminals 3 has a terminal portion 3a which is precisely bent into a predetermined shape, for example by means of pressing machine. The terminal portion 3a is bent substantially at right angle so that the terminal portion 3a is disposed along an upper surface of the exterior case 2 after it is molded. The terminal portion 3a is previously formed at its predetermined portion with an insertion hole 4 though which the fastening male screw member 9 is inserted. In a state in which the terminal portion 3a is disposed along the upper surface of the exterior case 2, a center axis of the insertion hole 4 coincides with a center axis of a screw hole (not shown) of the terminal nut 5.

In the power semiconductor module 10, in order to take out the electrodes, i.e., in order to take out electric signal sent through the electrode terminals 3, the electrode plate 7 which is the exterior connection electrode is electrically connected to the electrode terminals 3 which is exposed on the outer surface of the case. An insertion hole 8 through which the male screw member 9 is inserted is previously formed in the vicinity of a tip end of the electrode plate 7 like the electrode terminals 3. When the electrode terminal 3 and the electrode plate 7 are electrically connected to each other, as shown in FIG. 2, the electrode terminal 3 and the electrode plate 7 are fastened to the outer surface of the case in a state in which the electrode plate 7 is superposed on the electrode terminal 3. In this embodiment, the male screw member 9 and a fastening nut 11 are used as the fastening members.

The fastening operation using the male screw member 9 and the fastening nut 11 are carried out in the following manner. First, the male screw member 9 is threadedly engaged with the terminal nut 5 fixed in the first recess 2a on side of the outer surface of the case while inserting the male screw member 9 into the insertion hole 4 of the electrode terminal 3. Next, the male screw member 9 projected from the upper surface of the electrode terminal 3 is inserted into the insertion hole 8 to dispose the electrode plate 7. Thereafter, using the fastening nut 11, the electrode terminal 3 and the electrode plate 7 are fastened to the upper surface of the case.

If the male screw member 9 and the fastening nut 11 are used as the fastening members for fastening the electrode terminal 3 and the electrode plate 7 to the outer surface of the case, the position of the electrode plate 7 is automatically determined by disposing the electrode plate 7 while inserting the male screw member 9 into the insertion hole 8. Therefore, it is possible to easily position the electrode plate 7 such that the center axis of the insertion hole 8 of the electrode plate 7 coincides with the center axis of the insertion hole 4 of the electrode terminal 3. In this case, it is unnecessary to hold the electrode plate 7 at a predetermined position in fastening. Thus, it is possible to shorten the time required for electrically connecting both the members. Further, in this case, the existing power semiconductor module can be used as it is, and the above-described effect can be obtained without increasing the cost.

Although a portion of the electrode terminal 3 (terminal portion 3a) is bent such as to extend along the upper surface of the case and it only covers the terminal nut 5 fixed on side of the outer surface of the case in the first embodiment, the present invention is not limited to this, and a lower surface of the electrode terminal 3 and an upper surface of the terminal nut 5 may be adhered to each other using a resin adhesive and an adhesive tape. Thus, it is possible to restrain rattle of the terminal nut 5 when the male screw member 9 is threadedly engaged with the terminal nut 5.

Another embodiment of the invention will be explained below. In the following explanation, the same members as those in the first embodiment are designated with the same reference numbers, and further explanation is omitted.

Second Embodiment

Figure 3:
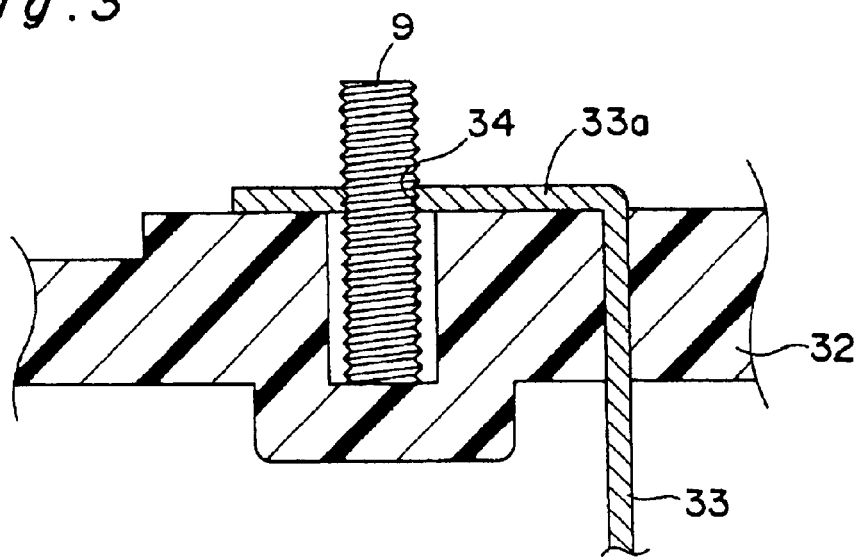
FIG. 3 is an enlarged cross-sectional explanatory view of a connection structure between an electrode terminal and an external connection electrode on an exterior case for a power semiconductor module of an second embodiment of the invention.

FIG. 3 is an enlarged cross-sectional explanatory view of an exterior case for a power semiconductor module and a male screw member mounted to the case according to the second embodiment of the invention. In this second embodiment, in a terminal portion 33a of an electrode terminal 33, a female screw hole 34 is formed along a thickness direction of the terminal portion 33a. In this case, since the male screw member 9 is threadedly engaged with the electrode terminal 33 directly, it is unnecessary to embed the terminal nut 5 (see FIG. 2) into an exterior case 32. Therefore, the number of parts required for assembling the power semiconductor module can be reduced.

Third Embodiment

Figure 4:
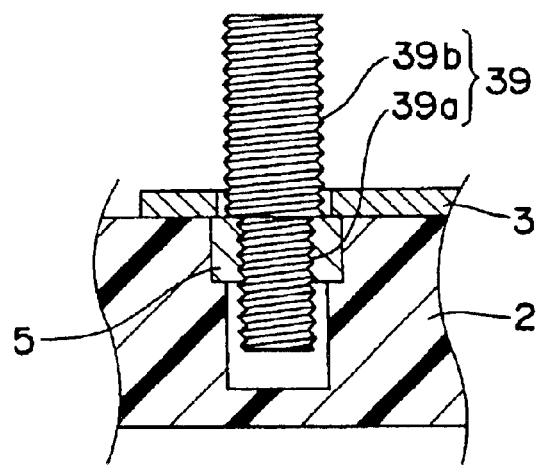
FIG. 4 is an enlarged cross-sectional explanatory view of an exterior case for a power semiconductor module and a male screw member mounted to the case according to an third embodiment of the invention.

FIG. 4 is an enlarged cross-sectional explanatory view of an exterior case for a power semiconductor module and a male screw member mounted to the case according to the third embodiment of the invention. In this third embodiment, a member whose nominal diameter is varied in the middle of its longitudinal direction is used as a male screw member 39 which is threadedly engaged with the terminal nut 5 fixed on side of the outer surface of the exterior case 2. That is, the male screw member 39 comprises a small-diameter portion 39a corresponding to a female screw of the terminal nut 5, and a large-diameter portion 39b having a nominal diameter greater than the small-diameter portion 39a. In this case, a nut greater than the terminal nut 5 is used as a fastening nut which is threadedly engaged with the large-diameter portion 39b. That is, in this third embodiment, nuts having different size are used for the small-diameter portion 39a and the large-diameter portion 39b.

When the male screw member 39 is mounted, as the small-diameter portion 39a is threadedly engaged with the terminal nut 5, the male screw member 39 is restricted at a position where a lower end of the large-diameter portion 39b abuts against an upper surface of the terminal nut 5, and this controls the length of the male screw member 39 projecting outward. As a result, it is easy to position the male screw member 39 with respect to the exterior case 2, and the power semiconductor module can be assembled more efficiently.

Fourth Embodiment

Figure 5:
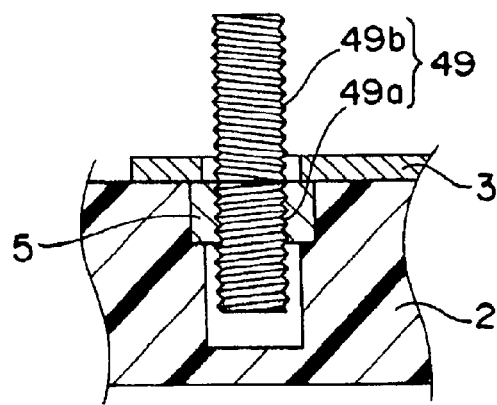
FIG. 5 is an enlarged cross-sectional explanatory view of an exterior case for a power semiconductor module and a male screw member mounted to the case according to an fourth embodiment of the invention.

FIG. 5 is an enlarged cross-sectional explanatory view of an exterior case for a power semiconductor module and a male screw member mounted to the case according to the embodiment 4 of the invention. In this fourth embodiment, a member having threading direction becomes opposite in the middle of its longitudinal direction is used as a male screw member 49 which is threadedly engaged with the terminal nut 5 fixed on side of the outer surface of the exterior case 2. That is, the male screw member 49 comprises a first screw thread 49a corresponding to the female screw of the terminal nut 5, and a second screw thread 49b having thread formed in opposite direction as that of first screw thread 49a. In this case, a nut having a screw thread opposite from the female screw of the terminal nut 5 is used as the fastening number which is threadedly engaged with the second screw thread 49b. That is, in this fourth embodiment, nuts having opposite screw threads are used for the first screw thread 49a and the second screw thread 49b.

When the male screw member 49 is mounted, as the first screw thread 49a is threadedly engaged with the terminal nut 5, the male screw member 49 is restricted at a position where the second screw thread 49b comes to the upper end of the female screw of the terminal nut 5, and this controls the length of the male screw member 69 projecting outward. As a result, it is easy to position the male screw member 69 with respect to the exterior case 2, and the power semiconductor module can be assembled more efficiently.

Fifth Embodiment

Figure 6:
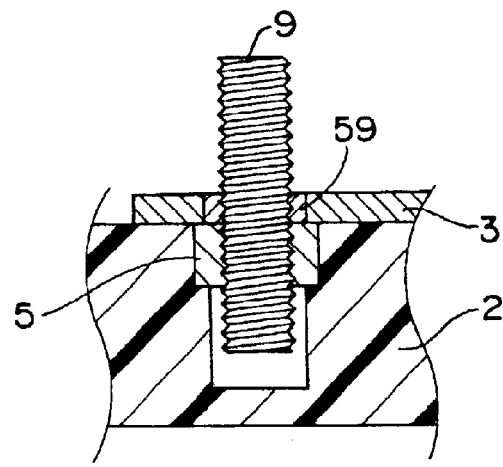
FIG. 6 is an enlarged cross-sectional explanatory view of an exterior case for a power semiconductor module and a male screw member mounted to the case according to an fifth embodiment of the invention.

FIG. 6 is an enlarged cross-sectional explanatory view of an exterior case for a power semiconductor module and a male screw member mounted to the case according to the fifth embodiment of the invention. In this fifth embodiment, a position restricting nut 59 is mounted to a longitudinally middle portion of the male screw member 9 which is threadedly engaged with the terminal nut 5 fixed on side of the outer surface of the exterior case 2. In this case, as the male screw member 9 is threadedly engaged with the terminal nut 5, the male screw member 9 is restricted at a position where the position restricting nut 59 abuts against the upper surface of the terminal nut 5, and this controls the length of the male screw member 59 projecting outward. As a result, it is easy to position the male screw member 59 with respect to the exterior case 2, and the power semiconductor module can be assembled more efficiently.

Sixth Embodiment

Figure 7:
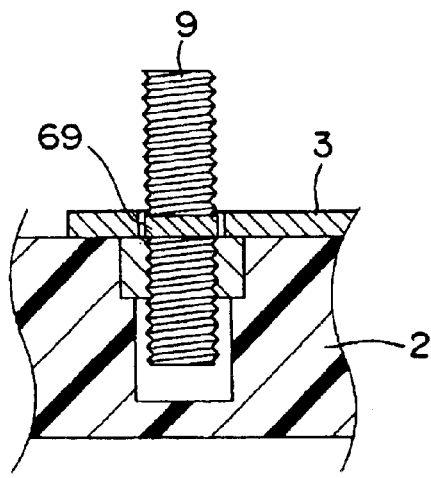
FIG. 7 is an enlarged cross-sectional explanatory view of an exterior case for a power semiconductor module and a male screw member mounted to the case according to an sixth embodiment of the invention.

FIG. 7 is an enlarged cross-sectional explanatory view of an exterior case for a power semiconductor module and a male screw member mounted to the case according to the sixth embodiment of the invention. In this sixth embodiment, a longitudinally middle portion of the male screw member 9 which is threadedly engaged with the terminal nut 5 fixed on side of the outer surface of the exterior case 2 is provided with a discontinuous portion 69 formed with no screw thread. In this case, as the male screw member 9 is threadedly engaged with the terminal nut 5, the male screw member 9 is restricted at a position where the discontinuous portion 69 comes to the upper end of the female screw of the terminal nut 5, and this controls the length of the male screw member 69 projecting outward. As a result, it is easy to position the male screw member 69 with respect to the exterior case 2, and the power semiconductor module can be assembled more efficiently.

Seventh Embodiment

Figure 8:
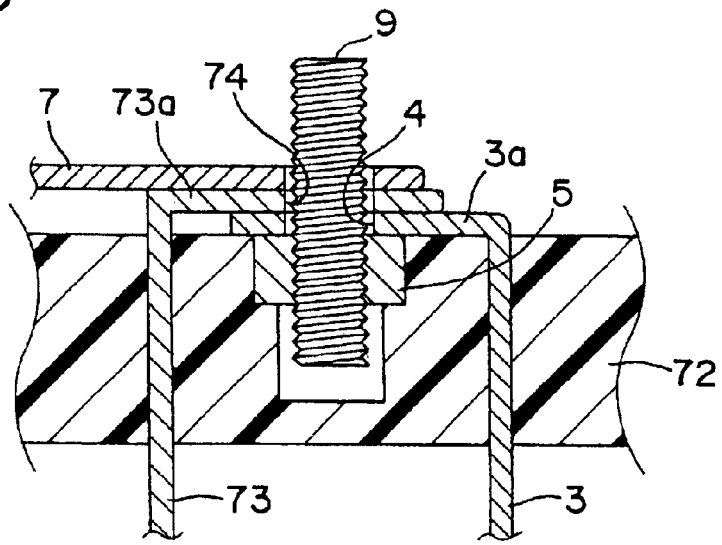
FIG. 8 is an enlarged cross-sectional explanatory view of an exterior case for a power semiconductor module and a male screw member mounted to the case according to an seventh embodiment of the invention.
Figure 9:
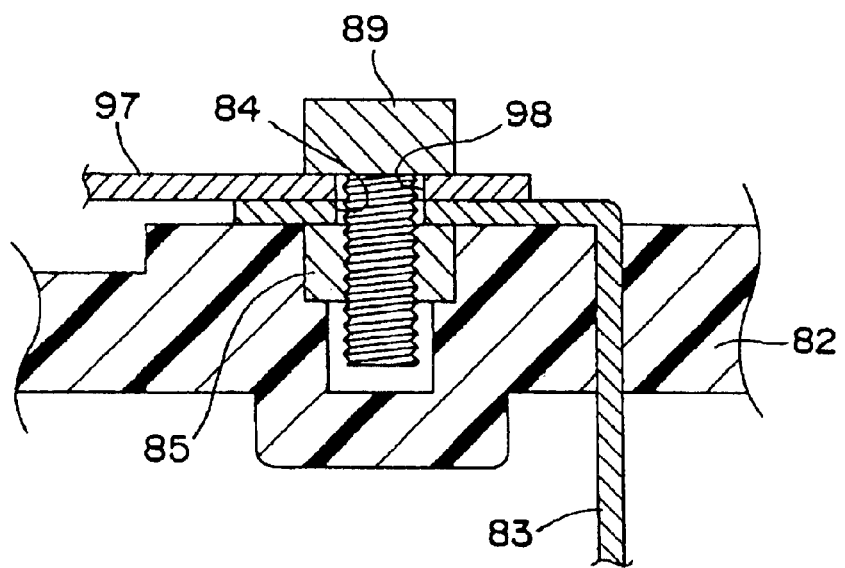
FIG. 9 is a cross-sectional explanatory view showing an electrode structure of a conventional power semiconductor module.

FIG. 8 is an enlarged cross-sectional explanatory view of an exterior case for a power semiconductor module and a male screw member mounted to the case according to the seventh embodiment of the invention. In this seventh embodiment, a plurality of electrode terminals are electrically connected to one electrode plate 7. That is, A terminal portion 3a of the electrode terminal 3 (called first electrode terminal, hereinafter) and a terminal portion 73a of another electrode terminal (called second electrode terminal, hereinafter) 73 are disposed on a terminal nut 7 fixed on side of an outer surface of an exterior case 72. Like the first electrode terminal 3, the terminal portion 73a of the second electrode terminal is formed with an insertion hole 74 through which the male screw member 9 is inserted. A center axis of the insertion hole 74 of the second electrode terminal 73 coincides with a center axis of the insertion hole 4 of the first electrode terminal 3. When the male screw member 9 is mounted to the exterior case 72, the male screw member 9 is inserted through the insertion holes 4 and 74 formed in the first and second electrode terminals 3 and 73 and threadedly engaged with the terminal nut 5. Operation after the electrode plate 7 is disposed is the same as that of the first embodiment. Two electrode terminals 3 and 73 can be electrically connected to one electrode plate 7 in this manner.

The present invention should not be limited to the above embodiments, and it is of course possible to variously improve and change design within scope without departing subject matter of the invention.

What is claimed is:

1. A power semiconductor module, comprising:

an electrode terminal connected with an electric power semiconductor device which is resin sealed inside of a case at one end while having a hole and exposed along a side of an outer surface of the case at the other end;

an electrode plate for external connection having a hole and arranged to overlie said electrode terminal on the outer surface of the case;

a nut embedded in the outer surface of the case and located adjacent to a lower surface of the electrode terminal, the nut comprising a female screw hole provided to correspond to said hole of the electrode terminal; and a male screw member comprising screw threads, the male screw member comprising a small-diameter portion engaging threadedly with the female screw hole of the nut and a large-diameter portion having a diameter greater than the small diameter portion, the male screw member mounted penetratingly through said hole of said electrode terminal and engaging threadedly with the female screw hole so that the male screw member is restricted at a position where a lower end of the large-diameter portion abuts against an upper surface of the nut at a side of the small-diameter portion while projecting from an upper surface of the electrode terminal at a side of the large-diameter portion, wherein said electrode plate for external connection is electrically connected with said electrode terminal on the outer surface of the case by placing said electrode plate so that the large-diameter portion of the male screw member passes through said hole of the electrode plate, and then engaging a nut with the large-diameter portion of the male screw member.

2. The power semiconductor module according to claim 1, wherein said male screw member is threadedly engaged with said female screw hole through a plurality of electrode terminals.

3. A power semiconductor module, comprising:

an electrode terminal connected with an electric power semiconductor device which is resin sealed inside of a case at one end while having a hole and exposed along a side of an outer surface of the case at the other end;

an electrode plate for external connection having a hole and arranged to overlie the electrode terminal on the outer surface of the case;

a nut embedded in the outer surface of the case and located adjacent to a lower surface of the electrode terminal, the nut comprising a female screw hole provided to correspond to the hole of the electrode terminal; and a male screw member comprising a first portion including screw thread engaging threadedly with the female screw hole of the nut, a second portion including screw threads, and a discontinuous portion not including screw threads between the first and second portions at a middle portion of the male screw member, the male screw member mounted penetratingly through the hole of the electrode terminal and engaging threadedly with the female screw hole so that the male screw member is restricted at a position where the discontinuous portion is disposed adjacent an upper end of the female screw hole of the nut while projecting from an upper surface of the electrode terminal at a side of the second portion, wherein the electrode plate for external connection is electrically connected with the electrode terminal on the outer surface of the case by placing the electrode plate so that the second portion of the male screw member passes through the hole of the electrode plate, and then engaging a nut with the second portion of the male screw member.

4. The power semiconductor module according to claim 3, wherein the male screw member is threadedly engaged with the female screw hole through a plurality of electrode terminals.

* * * * *